(12) United States Patent
Shimanek et al.

(10) Patent No.: US 8,090,758 B1
(45) Date of Patent: Jan. 3, 2012

(54) ENHANCED MULTIPLIER-ACCUMULATOR LOGIC FOR A PROGRAMMABLE LOGIC DEVICE

(75) Inventors: Schuyler E. Shimanek, Albuquerque, NM (US); William E. Allaire, West Chester, PA (US); Steven J. Zack, Burlington, NJ (US)

(73) Assignee: Xilinx, Inc., San Jose, CA (US)

( * ) Notice: Subject to any disclaimer, the term of this patent is extended or adjusted under 35 U.S.C. 154(b) by 1194 days.

(21) Appl. No.: 11/639,994

(22) Filed: Dec. 14, 2006

(51) Int. Cl.
*G06F 7/38* (2006.01)
(52) U.S. Cl. .................................. 708/523; 708/501
(58) Field of Classification Search .................. None
See application file for complete search history.

(56) References Cited

U.S. PATENT DOCUMENTS

| | | | | |
|---|---|---|---|---|
| 5,835,393 | A * | 11/1998 | Melanson et al. | 708/628 |
| 7,472,155 | B2 * | 12/2008 | Simkins et al. | 708/523 |
| 7,480,690 | B2 * | 1/2009 | Simkins et al. | 708/523 |
| 7,567,997 | B2 * | 7/2009 | Simkins et al. | 708/523 |
| 7,660,841 | B2 * | 2/2010 | Zheng et al. | 708/490 |
| 7,882,165 | B2 * | 2/2011 | Simkins et al. | 708/490 |
| 7,962,716 | B2 * | 6/2011 | Master et al. | 712/11 |
| 2010/0191786 | A1 * | 7/2010 | Simkins et al. | 708/209 |

OTHER PUBLICATIONS

Author: Xilinx, Inc.; Title: XtremeDSP for Virtex-4 FPGAs; Date: May 15, 2008 Early Revision Date of Sep. 9, 2004; URL: http://direct.xilinx.com/support/documentation/user_guides/ug073.pdf.*
Xilinx Inc., "XtremeDSP Design Considerations User Guide", Document Identifier UG073, v1.2, Feb. 4 2005.*

* cited by examiner

*Primary Examiner* — Lewis Bullock, Jr.
*Assistant Examiner* — Matthew Sandifer
(74) *Attorney, Agent, or Firm* — Robert M. Brush; LeRoy D. Maunu; Lois D. Cartier (57) ABSTRACT

A multiplier-accumulator includes a pre-adder, a multiplier, an accumulator, multiplexing logic, and control logic. The pre-adder is configured to sum a first input and a second input to produce a pre-sum output. The multiplier is configured to multiply a third input and the pre-sum output to produce a product output. The accumulator is configured to sum a pair of accumulator inputs to produce a sum output. The multiplexer is configured to select the pair of accumulator inputs from a plurality of multiplexer inputs, where the plurality of multiplexer inputs includes the product output and the sum output. The control logic is configured to control operation of the pre-adder, the accumulator, and the multiplexer logic. In an example, each of the first input, the second input, the third input, and the sum output is coupled to programmable interconnect of a programmable logic device.

17 Claims, 6 Drawing Sheets

FIG. 6

ENHANCED MULTIPLIER-ACCUMULATOR LOGIC FOR A PROGRAMMABLE LOGIC DEVICE

FIELD OF THE INVENTION

One or more aspects of the invention relate to digital logic circuits and, more particularly, to enhanced multiplier-accumulator logic for a programmable logic device.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Dedicated logic circuits configured to perform specific functions are commonly embedded into PLDs. For example, devices in the VIRTEX®-4 family of FPGAs manufactured by Xilinx, Inc., include dedicated digital signal processor (DSP) blocks. Each DSP block (also referred to as a tile) includes a pair of multiplier-accumulator (MACC) circuits. The MACC circuits provide a dedicated hardware solution for performing various types of filtering and mathematical functions related to DSP. Some particular DSP applications, however, require logic in addition to the MACC circuits for operation. This additional logic must be configured using the fabric of the FPGA (e.g., using CLB resources).

For example, a MACC may be used to implement a finite impulse response (FIR) filter. In an FIR filter, each input data sample is multiplied by a corresponding coefficient and the result (referred to as an inner product) is accumulated with other results. Some FIR filters, known as symmetric FIR filters, require pairs of data samples to be summed before being processed by the MACC. Presently, to implement a symmetric FIR filter, a pre-adder must be configured using the CLB fabric of the FPGA to sum pairs of data samples. Among basic elements, however, adders and subtractors are among the slowest when programmed into the CLB fabric. Adders and subtractors also consume a large amount of CLB resources. Accordingly, there exists a need in the art for enhanced multiplier-accumulator logic in a PLD.

SUMMARY OF THE INVENTION

An aspect of the invention relates to a multiplier-accumulator circuit including a pre-adder, a multiplier, multiplexing logic, an accumulator, and control logic. The pre-adder includes a first input, a second input, a control input, and an output. The multiplier includes a first input, a second input, and an output, where the second input of the multiplier is coupled to the output of the pre-adder. The multiplexing logic includes a plurality of inputs, a control input, a first output, and a second output, where a first one of the plurality of inputs is coupled to the output of the multiplier. The accumulator includes a first input, a second input, a control input, and an output, where the first input and the second input of the accumulator are coupled to the first output and the second output of the multiplexer, respectively, and the output of the accumulator is coupled to a second one of the plurality of inputs of the multiplexing logic. The control logic includes an input and multiple outputs, where the outputs of the control logic are respectively coupled to the control input of the pre-adder, the control input of the multiplexing logic, and the control input of the accumulator. In an embodiment, the multiplier-accumulator is embedded in a programmable logic device (PLD). The first input and the second input of the pre-adder, the first input of the multiplier, the output of the accumulator, and the input of the control logic are coupled to programmable interconnect of the PLD. In an embodiment, one of the plurality of inputs of the multiplexing logic is coupled to at least a portion of the first input of the pre-adder, at least a portion of the first input of the multiplier, and at least a portion of the second input of the pre-adder or at least a portion of the output of the pre-adder.

Another aspect of the invention relates to an apparatus for multiplication and accumulation in a PLD. A pre-adder is configured to sum a first input and a second input to produce a pre-sum output. A multiplier is configured to multiply a third input and the pre-sum output to produce a product output. An accumulator is configured to sum a pair of accumulator inputs to produce a sum output. A multiplexer is configured to select the pair of accumulator inputs from a plurality of multiplexer inputs, where the plurality of multiplexer inputs includes the product output and the sum output. Control logic is configured to control operation of the pre-adder, the accumulator, and the multiplexer logic. In an embodiment, each of the first input, the second input, the third input, and the sum output is coupled to programmable interconnect of the PLD.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

Figure 1:
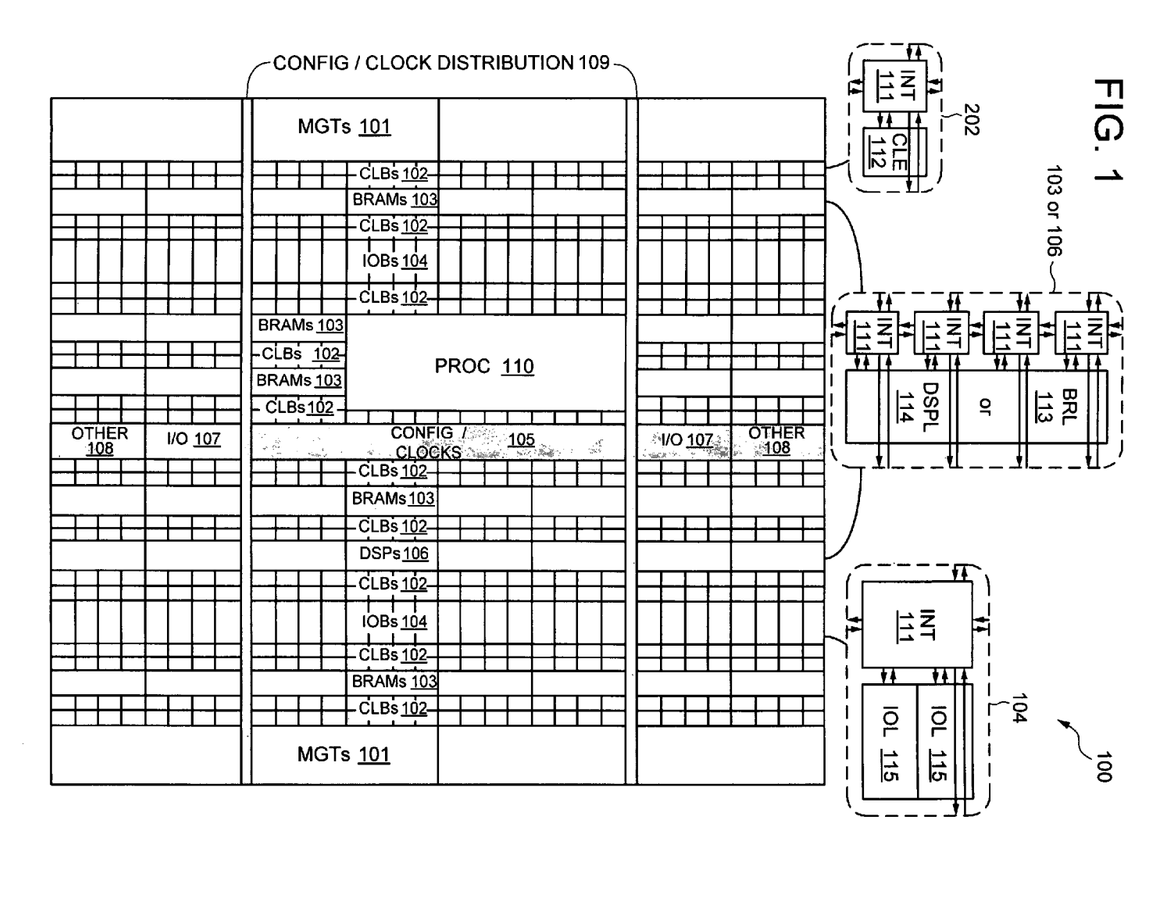
FIG. 1 is block diagram illustrating an exemplary embodiment of an FPGA.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 111) also includes the connections to and from the programmable logic element within the same tile, as shown by the examples included at the top of FIG. 1. The programmable interconnect element (INT 111) may also include connections via routing conductor segments to and from a corresponding interconnect element that span multiple columns of logic. That is, routing conductor segments may span a plurality of tiles (e.g., a "hex" line spans six tiles).

For example, a CLB 102 can include a configurable logic element (CLE 112) that can be programmed to implement user logic plus a single programmable interconnect element (INT 111). In an embodiment, the CLE 112 includes four slices (not shown) of logic. A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An 10B 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs is typically included wherever the CLBs appear, to facilitate the efficient implementation of user logic. Examples of FPGAs that may be used with embodiments of the invention are the VIRTEX 4 FPGAs available from Xilinx, Inc., of San Jose, Calif.

Figure 2:
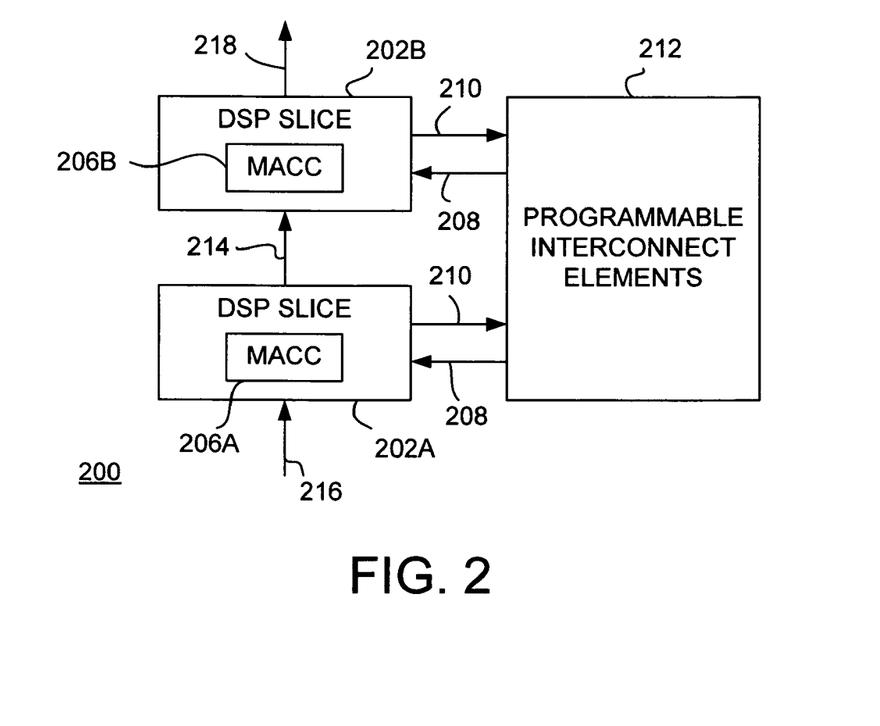
FIG. 2 is a block diagram depicting an exemplary embodiment of a DSP tile in an FPGA in accordance with one or more aspects of the invention.

FIG. 2 is a block diagram depicting an exemplary embodiment of a DSP tile 106 in accordance with one or more aspects of the invention. The DSP tile 106 illustratively includes a first slice 202A and a second slice 202B. The slices 202A and 202B include multiplier-accumulator (MACC) logic 206A and 206B, respectively. The MACC logic 206A and 206B are identical and thus each may be generally referred to herein as MACC logic 206. Each of the slices 202A and 202B includes input terminals 208 and output terminals 210 coupled to programmable interconnect elements 212. The slice 202A is also coupled to the slice 202B via terminals 214. The slice 202A also includes input terminals 216 from another slice in an adjacent DSP tile. The slice 202B also includes output terminals 218 coupled to another slice in an adjacent DSP tile. Accordingly, the slices 202A and 202B may be cascaded with each other and/or with other slices in adjacent DSP tiles, as discussed more fully below.

Figure 3:
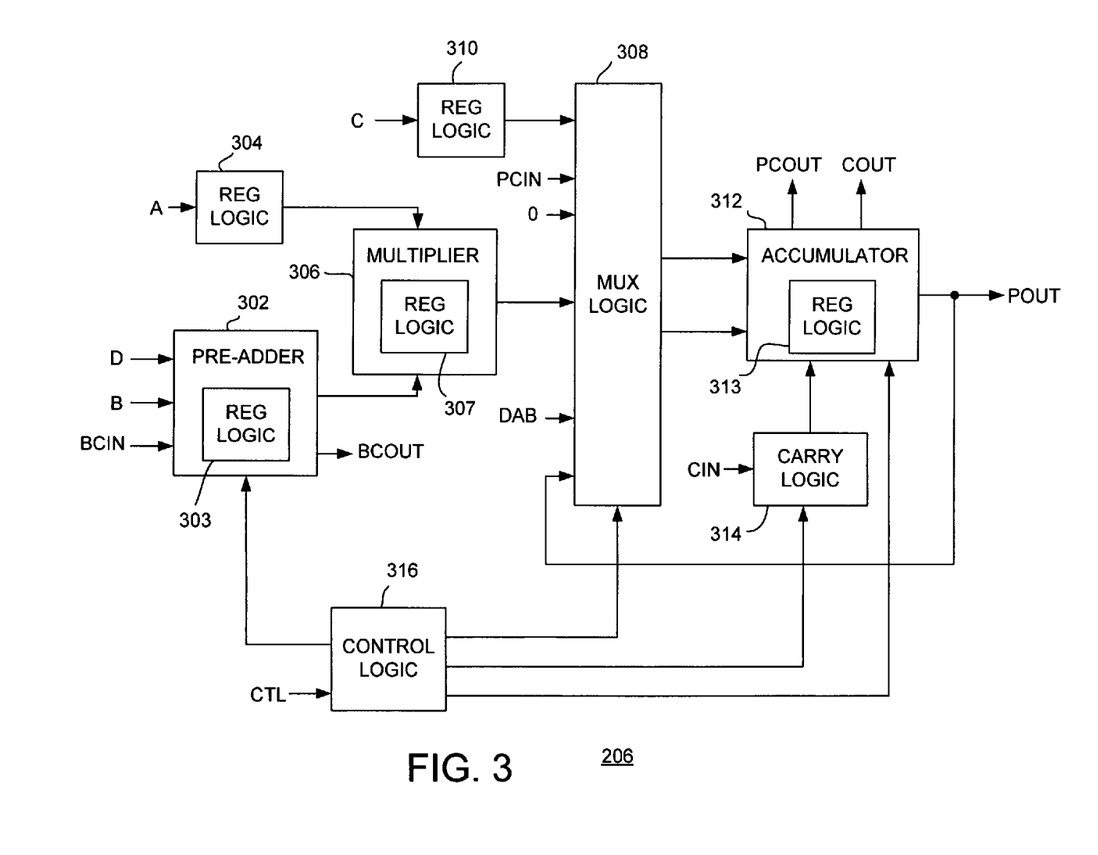
FIG. 3 is a block diagram depicting an exemplary embodiment of multiplier-accumulator (MACC) logic in accordance with one or more aspects of the invention.

FIG. 3 is a block diagram depicting an exemplary embodiment of the MACC logic 206 in accordance with one or more aspects of the invention. The MACC logic 206 includes a pre-adder 302, register logic 304, multiplier 306, multiplexing logic 308, register logic 310, accumulator 312, carry logic 314, and control logic 316. The MACC logic 206 includes inputs A, B, C, D, CIN, PCIN, BCIN, and CTL. The MACC logic 206 includes outputs POUT, PCOUT, COUT, and BCOUT. The inputs A, B, C, D, and CTL are coupled to programmable interconnect elements of the FPGA fabric. The inputs CIN, PCIN, and BCIN are coupled to another slice either in the same tile or in an adjacent DSP tile (i.e., cascaded inputs). The output POUT is coupled to programmable interconnect elements of the FPGA fabric. The outputs PCOUT, COUT, and BCOUT are coupled to another slice in either the same tile or in an adjacent tile (cascaded outputs).

An input terminal of the register logic 304 is coupled to the input A. An output terminal of the register logic 304 is coupled to an input terminal of the multiplier 306. The register logic 304 may include one or more stages for buffering the input A. Input terminals of the pre-adder 302 are coupled to the inputs B, D, and BCIN. In one embodiment, the pre-adder 302 is configured to add or subtract two input data words, which may be either D and B or D and BCIN. Output terminals of the pre-adder 302 are coupled to an input terminal of the multiplier 306 and the BCOUT output, respectively. The BCOUT output provides the sum/difference computed by the pre-adder 302, which may be cascaded with a BCIN input of MACC logic in another slice. A control terminal of the pre-adder 302 is coupled to the control logic 316. The control logic 316 configures the pre-adder 302 to either compute a sum or a difference of the two input words. In one embodiment, the control logic 316 may also configure one of the B or BCIN inputs to bypass the addition/subtraction operation performed by the pre-adder 302. That is, the pre-adder 302 may be configured to provide either the B or BCIN input directly to the multiplier 306. The pre-adder 302 may also include register logic 303, which may include one or more stages for buffering the inputs D, B, and BCIN.

The multiplier 306 is configured to compute the product of the output of the pre-adder 302 and the output of the register logic 304. That is, the multiplier 306 may compute A×(D±B), A×(D±BCIN), A×B, or A×BCIN, depending on the configuration of the pre-adder 302. The multiplier 306 may include register logic 307, which may include one or more stages for buffering the output of the multiplier 306. An output terminal of the multiplier 306 is coupled to an input terminal of the multiplexing logic 308.

An input terminal of the register logic 310 is coupled to the input C. An output terminal of the register logic 310 is coupled to an input terminal of the multiplexing logic 308. The register logic 310 may include one or more stages for buffering the input C. Another input terminal of the multiplexing logic 308 is coupled to an output terminal of the accumulator 312. In addition to the output terminal of the multiplier 306, input terminals of the multiplexing logic 308 are coupled to the PCIN input and a logic '0' input. Yet another input terminal of the multiplexing logic 308 is configured to receive an input DAB. In one embodiment, the input DAB is a concatenation of the input A, the input D, and the output of the pre-adder 302. In one embodiment, a word from the input DAB comprises a word from the output of the pre-adder 302, a word from the output of the register logic 304, and at least a portion of a word from the input D (which may also be registered, as described above). Those skilled in the art will appreciate that the input DAB may be a concatenation of other signals in the MACC logic 206.

The multiplexing logic 308 includes two output terminals that are respectively coupled to two input terminals of the accumulator 312. Control terminals of the multiplexing logic 308 are coupled to the control logic 316. The control logic 316 configures the multiplexing logic 308 to select a pair of the inputs to be coupled to the accumulator 312. An input terminal of the carry logic 314 is coupled to the input CIN. An output terminal of the carry logic 314 is coupled to another input terminal of the accumulator 312. The carry logic 314 may include one or more register stages for buffering the input CIN. A control terminal of the carry logic 314 is coupled to the control logic 316. The control logic 316 configures the carry logic 314 to provide a carry bit from the input CIN or another bit-value to the accumulator 312 (e.g., a logic '0' if the carry is not used).

The accumulator 312 is configured to add or subtract two data words provided by the multiplexing logic 308 accounting for a carry bit provided by the carry logic 314. Output terminals of the accumulator 312 are coupled to the output POUT, the output PCOUT, and the output COUT. The accumulator 312 provides a carry bit via the output COUT and the result of the sum/difference operation via the output POUT and the output PCOUT. A control terminal of the accumulator 312 is coupled to the control logic 316. The control logic 316 configured the accumulator 312 to either compute a sum or a difference of the two input words. The accumulator 312 may also include register logic 313, which may include one or more stages for buffering the output POUT.

An input signal of the control logic 316 is coupled to the input CTL. The value of a word on the input CTL controls the operation of the MACC logic 206, as described above. Thus, some operational aspects of the MACC logic 206 may be controlled dynamically by driving the input CTL. Other aspects of the MACC logic 206 may be controlled or set via configuration of the FPGA. For example, the FPGA may be configured such that the inputs and outputs described above are either buffered by register logic or not.

Figure 4:
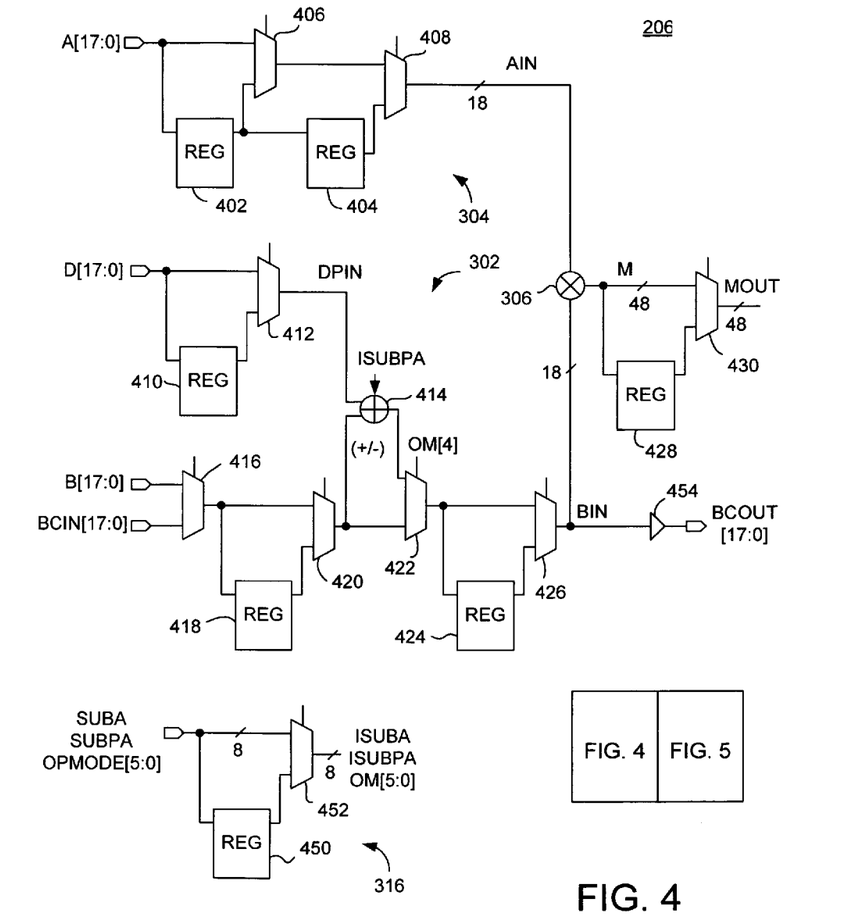
FIGS. 4 and 5 depict a block diagram of another exemplary embodiment of the MACC logic in accordance with one or more aspects of the invention.
Figure 5:
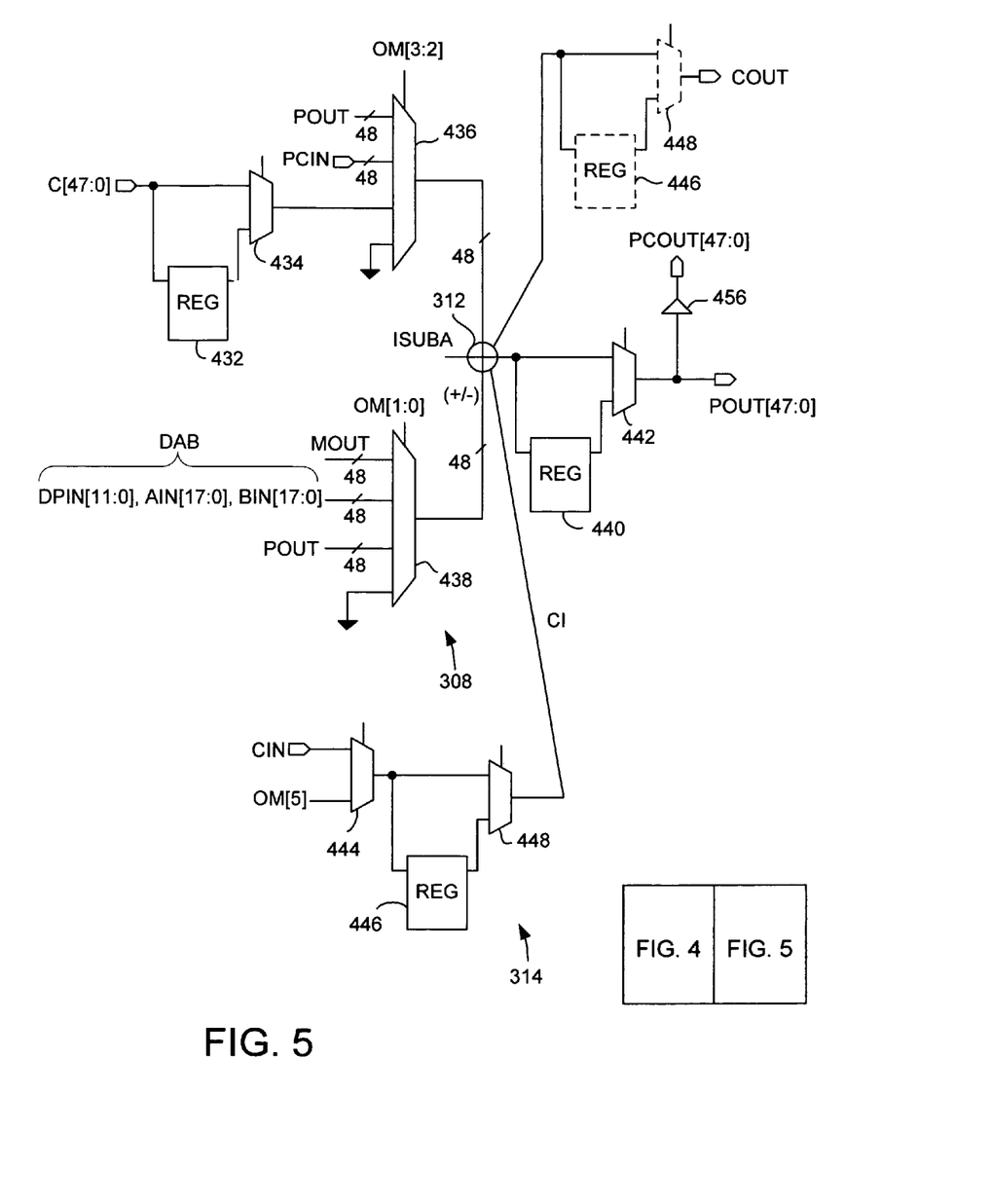

FIGS. 4 and 5 depict a block diagram of another exemplary embodiment of the MACC logic 206 in accordance with one or more aspects of the invention. FIG. 4 shows an illustrative implementation of the MACC logic shown in FIG. 3. In the present embodiment, the register logic 304 is a two-stage structure having registers 402 and 404 and multiplexers 406 and 408. The register logic 304 (in addition to other register logic described below) is "selectable" in that the multiplexers 406 and 408 control whether the input A is buffered. Thus, the combination of multiplexers and registers may be referred to herein as "selectable register logic." The input A is an 18-bit input and is coupled to an input of the register 402 and an input of the multiplexer 406. An output of the register 402 is coupled to an input of the multiplexer 406 and an input of the register 404. Inputs of the multiplexer 408 are coupled to an output of the multiplexer 406 and an output of the register 404, respectively. An output of the multiplexer 408 is coupled to the multiplier 306. Control of the multiplexers 406 and 408 is implemented through configuration of the FPGA (e.g., via configuration bits). The input A may be buffered in the register 402 or both the register 402 and the register 404. Alternatively, the input A may directly coupled to the multiplier 306 through the multiplexers 406 and 408. For purposes of clarity by example, registers are described herein as having an input and an output port (e.g., a D input and a Q output). Those skilled in the art will appreciate that a register includes various other terminals, including a reset (R) terminal, a clock enable (CE) terminal, a clock (CLK) terminal, and the like. Such terminals are omitted for clarity.

The pre-adder 302 includes registers 410, 418, and 424, multiplexers 412, 416, 420, 422, and 426, and a summer 414. The input D is an 18-bit input and is coupled to an input of the multiplexer 412 and an input of the register 410. An output of the register 410 is coupled to another input of the multiplexer 412. An output of the multiplexer 412 is coupled to an input of the summer 414. The inputs B and BCIN are 18-bit inputs and are coupled to inputs of the multiplexer 416, respectively. An output of the multiplexer 416 is coupled to an input of the multiplexer 420 and an input of the register 418. An output of the register 418 is coupled to another input of the multiplexer 420. An output of the multiplexer 420 is coupled to an input of the summer 414. The multiplexer 416 is configured to select between the input B and the input BCIN. The input D and the selected one of inputs B and BCIN may be buffered by the registers 410 and 418, respectively. Alternatively, the D and the selected one of the inputs B and BCIN may be directly coupled to the summer 414.

The summer 414 is configured to add or subtract the outputs of the multiplexer 412 and the multiplexer 420. The operation performed by the summer 414 is controlled by the ISUBPA signal provided by the control logic 316. The output of the summer 414 is coupled to an input of the multiplexer 422. The output of the multiplexer 420 is also coupled to an input of the multiplexer 422. An output of the multiplexer 422 is coupled to an input of the multiplexer 426 and an input of the register 424. An output of the register 424 is coupled to another input of the multiplexer 426. The output of the multiplexer 426 is coupled to one input of the multiplier 306 and to an input of a driver 454. An output of the driver 454 provides the output BCOUT. In the present embodiment, the output BCOUT is an 18-bit signal.

Control of the multiplexers 412, 416, 420, and 426 is implemented through configuration of the FPGA. A control terminal of the multiplexer 422 is coupled to receive the $5^{th}$ bit of the OM signal provided by the control logic (OM[4]). The signal OM[4] controls whether the multiplexer 422 selects the output of the summer 414 or the output of the multiplexer 420. The output of the multiplexer 422 may be buffered by the register 424 or directly coupled to the multiplier 306.

The multiplier 306 is an 18-bit multiplier that computes the product of the output of the multiplexer 408 and the output of the multiplexer 426. The register logic 307 includes a register 428 and a multiplexer 430. The output of the multiplier 306 is coupled to an input of the multiplexer 430 and an input of the register 428. The output of the multiplier 306 is designated as M. The product of two 18-bit signals results in a 36-bit signal. In one embodiment, the output of the multiplier 306 is increased to 48-bits through a sign extension operation, which is well known in the art. The output M may be buffered by the register 428 or directly coupled to the multiplexing logic 308 via the multiplexer 430. Control of the multiplexer 430 is implemented through configuration of the FPGA.

The multiplexing logic 308 includes a multiplexer 436 and a multiplexer 438. Each of the multiplexers 436 and 438 are four-input multiplexers. Inputs of the multiplexer 438 are coupled to a logic '0' signal, the output POUT, the DAB signal, and an output of the multiplexer 430. In the present embodiment, the DAB signal is a 48-bit signal. The 18 least-significant bits of the DAB signal include the output of the multiplexer 426 (designated BIN), the next 18 bits of the DAB signal include the output of the multiplexer 408 (designated AIN), and the 12 most-significant bits of the DAB signal include the 12 least significant bits of the output of the multiplexer 412 (designated DPIN). A control terminal of the multiplexer 436 is configured to receive the two-bit signal OM[3:2], which can be used to dynamically select an input of the multiplexer 436. A control terminal of the multiplexer 438 is configured to receive the two-bit signal OM[1:0], which can be used to dynamically select an input of the multiplexer 438.

The register logic 310 includes a register 432 and a multiplexer 434. The input C is a 48-bit signal that is coupled to an input of the register 432 and an input of the multiplexer 434. An output of the register 432 is coupled to another input of the multiplexer 434. The input C may be buffered by the register 432 is directly coupled to the multiplexer 436 via the multiplexer 434. Control of the multiplexer 434 is implemented through configuration of the FPGA. Inputs of the multiplexer 436 are coupled to a logic '0' signal, an output of the multiplexer 434, the input PCIN, and the output POUT. The input PCIN and the output POUT are each 48-bit signals.

In one embodiment, the carry logic 314 includes a multiplexer 444, a register 446, and a multiplexer 448. One input of the multiplexer 444 is coupled to the input CIN, and the other input is coupled to the $6^{th}$ bit of the OM signal provided by the control logic 316 (0M[5]). An output of the multiplexer 444 is coupled to an input of the register 446 and an input of the multiplexer 448. An output of the register 446 is coupled to another input of the multiplexer 448. The output of the multiplexer 444 may be buffered by the register 446 or directly coupled to the accumulator 312 via the multiplexer 448. Control of the multiplexers 444 and 448 is implemented through configuration of the FPGA. In an alternative embodiment, the output of the multiplexer 444 is coupled directly to the accumulator 312. The register 446 and the multiplexer 448 are coupled to the carry output of the accumulator 312. In this case, the multiplexer 448 selectively buffers the output COUT.

Inputs of the accumulator 312 are coupled to an output of the multiplexer 436, an output of the multiplexer 438, and an output of the multiplexer 448, respectively. The output of the multiplexer 436 is designated as Z and is a 48-bit signal. The output of the multiplexer 438 is designated as X and is also a 48-bit signal. The output of the multiplexer 448 is a 1-bit signal designated as Cl. The operation performed by the accumulator 312 is controlled by the ISUBA signal provided by the control logic 316 (i.e., sum or difference). The register logic 313 includes a register 440 and a multiplexer 442. An output of the accumulator 312 is coupled to an input of the register 440 and an input of the multiplexer 442. An output of the register 440 is coupled to another input of the multiplexer 442. An output of the multiplexer 442 provides the output POUT. The output of the multiplexer 442 is also coupled to a driver 456, which provides a signal PCOUT (i.e., cascaded POUT). The output of the accumulator 312 may be buffered by the register 440 or directly output via the multiplexer 442. Control of the multiplexer 442 is implemented through configuration of the FPGA. The accumulator 312 also provides the output LOUT (carry out).

The control logic 316 includes a register 450 and a multiplexer 452. An input of the register 450 and an input of the multiplexer 452 receives the input CTL. The input CTL includes a suba signal, a subpa signal, and an opmode signal. The suba signal is a 1-bit signal that controls the operation of the accumulator 312. The subpa signal is a 1-bit signal that controls the operation of the summer 414 in the pre-adder 302. The opmode signal is a 6-bit signal that controls the operation of the multiplexer 422, the multiplexer 436, and the multiplexer 438, as well as provides a 1-bit input to the multiplexer 444. An output of the register 450 is coupled to another input of the multiplexer 452. The output of the multiplexer 452 provides the CTL signals either directly or buffered through the register 450. The output of the multiplexer 452 is designated as ISUBA, ISUBPA, and OM[5:0]. ISUBA corresponds to suba, ISUBPA corresponds to subpa, and OM[5:0] corresponds to opmode.

Embodiments of the MACC 206 described above may advantageously be used in applications that require a pre-addition before multiplication/accumulation. For example, embodiments of the MACC 206 may be used to implement symmetric finite impulse response (FIR) filters. FIR filters are one of the most basic building blocks used in digital signal processing. An ouput Y of an N tap FIR filter is given by the equation:

$$Y_t = a_0 X_t + a_1 X_{t-1} + \ldots + a_{N-2} X_{t-(N-2)} + a_{N-1} X_{t-(N-1)} \quad \text{Eq. 1,}$$

where X is the input to the filter and a0, a1 ... aN−1 are the filter's coefficients. If the coefficients exhibit such a symmetry that:

$$a_0 = a_{N-1}, a_1 = a_{N-2} \ldots \text{etc.,}$$

then the output Y of an N tap FIR filter becomes:

$$Y_t = a_0 (X_t + X_{t-(N-1)}) + a_1 (X_{t-1} + X_{t-(N-2)}) + \quad \text{Eq. 2.}$$

Equation 2 describes a symmetric FIR filter. As is apparent from Equation 2, two data samples must be summed prior to being multiplied by a coefficient. This summation may be performed by the pre-adder in embodiments of the MACC 206.

Figure 6:
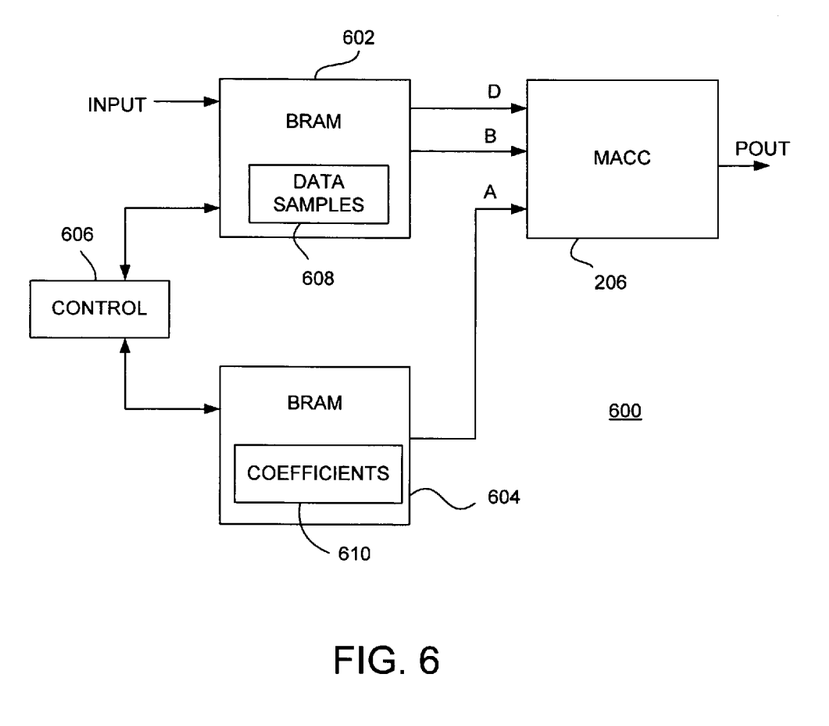
FIG. 6 is a block diagram depicting an exemplary embodiment of a symmetric FIR filter employing a MACC in accordance with one or more aspects of the invention.

For example, FIG. 6 is a block diagram depicting an exemplary embodiment of a symmetric FIR filter 600 in accordance with one or more aspects of the invention. The symmetric FIR filter 600 includes a BRAM 602, a BRAM 604, control logic 606, and a MACC 206. The BRAM 602 stores data samples 608 and includes an input for receiving the data samples 608. The BRAM 604 stores coefficients 610. Each of the BRAM 602 and 604 is coupled to the control logic 606. The control logic 606 provides addressing, enable, and like type signals to control operation of the BRAM 602 and the BRAM 604. The BRAM 602 provides two data samples to the MACC 206, and the BRAM 604 provides one coefficient to the MACC 206. The two data samples are coupled to the D and B inputs of the MACC 206, respectively. The coefficient is coupled to the A input of the MACC 206. In this manner, the two data samples are summed by the pre-adder 302 prior to being multiplied by the coefficient. This process is repeated and the resulting products are accumulated by the accumulator 312. When configured in an FPGA, the BRAM 602 and the BRAM 604 are coupled directly to the MACC 206, without traversing any intervening logic. That is, the MACC 206 obviates the need to implement a pre-adder using CLB resources of the FPGA. The MACC 206 improves performance and reduces power consumption by obviating the need to use the CLB fabric for implementing the pre-adder.

Those skilled in the art will appreciate that embodiments of the MACC 206 may be used in other applications that require a pre-addition operation. In an application requiring such pre-addition, the MACC 206 improves performance and reduces power consumption. The MACC 206 is capable of operating at higher frequencies that a conventional MACC in such applications requiring a pre-addition operation. Embodiments of the MACC 206 also provide for inputting two words directly to the accumulator 312 via the C and the DAB inputs. As described above, the C and DAB inputs receive signals from the programmable interconnect of the FPGA. For example, as shown in FIG. 4, the MACC 206 two 48-bit words may be directly coupled to the accumulator 312 via the C and DAB inputs. Thus, the accumulator 312 is capable of summing two words directly from the FPGA fabric at a much higher frequency than adders configured using CLB resources:

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Trademarks are the property of their respective owners.

What is claimed is:

1. A multiplier-accumulator circuit, comprising:
    a pre-adder having a first input, a second input, a control input, and an output;
    a multiplier having a first input, a second input, and an output, the second input of the multiplier being coupled to the output of the pre-adder;
    multiplexing logic having a plurality of inputs, a control input, a first output, and a second output, a first one of the plurality of inputs being coupled to the output of the multiplier, a second one of the plurality of inputs receiving a concatenation of respective portions of the first input of the pre-adder, the second output of the pre-adder, and the first input of the multiplier;
    an accumulator having a first input, a second input, a control input, and an output, the first input and the second input of the accumulator being coupled to the first output and the second output of the multiplexer, respectively, and the output of the accumulator being coupled to a second one of the plurality of inputs of the multiplexing logic; and
    control logic having an input and a plurality of outputs, the outputs of the control logic being respectively coupled to the control input of the pre-adder, the control input of the multiplexing logic, and the control input of the accumulator,
    wherein the pre-adder produces a pre-sum of the first and second pre-adder inputs,
    wherein the multiplier produces a product of the multiplier inputs,
    wherein the accumulator produces a sum of the first and second accumulator inputs,
    wherein the multiplexing logic selects from the plurality of inputs as the first and second multiplexing logic outputs, and
    wherein the control logic controls operation of the pre-adder, the accumulator, and the multiplexing logic.

2. The multiplier-accumulator circuit of claim 1, wherein each of the pre-adder, the multiplier, and the accumulator includes selectable register logic.

3. The multiplier-accumulator circuit of claim 2, further comprising:
    first selectable register logic having an input and an output, the output of the first selectable register logic being coupled to the first input of the multiplier; and
    second selectable register logic having an input and an output, the output of the second selectable register logic being coupled to a third one of the plurality of inputs of the multiplexing logic.

4. The multiplier-accumulator circuit of claim 1, wherein the accumulator includes a carry input, and wherein the multiplier-accumulator circuit further comprises:
    carry logic having an output coupled to the carry input of the accumulator.

5. A multiplier-accumulator circuit in a programmable logic device (PLD), comprising:
    a pre-adder having a first input, a second input, a control input, and an output, the first input and the second input being coupled to programmable interconnect of the PLD;
    a multiplier having a first input, a second input, and an output, the second input of the multiplier being coupled to the output of the pre-adder and the first input of the multiplier being coupled to the programmable interconnect of the PLD;
    multiplexing logic having a plurality of inputs, a control input, a first output, and a second output, a first one of the plurality of inputs being coupled to the output of the multiplier, a second one of the plurality of inputs receiving a concatenation of respective portions of the first input of the pre-adder, the output of the pre-adder, and the first input of the multiplier, and a third one of the plurality of inputs being coupled to the programmable interconnect of the PLD;
    an accumulator having a first input, a second input, a control input, and an output, the first input and the second input of the accumulator being coupled to the first output and the second output of the multiplexer, respectively, and the output of the accumulator being coupled to a second one of the plurality of inputs of the multiplexing logic and to the programmable interconnect of the PLD; and
    control logic having an input and a plurality of outputs, the outputs of the control logic being respectively coupled to the control input of the pre-adder, the control input of the multiplexing logic, and the control input of the accumulator, and the input of the control logic being coupled to the programmable interconnect of the PLD,
    wherein the pre-adder produces a pre-sum of the first and second pre-adder inputs,
    wherein the multiplier produces a product of the multiplier inputs,
    wherein the accumulator produces a sum of the first and second accumulator inputs,
    wherein the multiplexing logic selects from the plurality of inputs as the first and second multiplexing logic outputs, and
    wherein the control logic controls operation of the pre-adder, the accumulator, and the multiplexing logic.

6. The multiplier-accumulator circuit of claim 5, wherein each of the pre-adder, the multiplier, and the accumulator includes selectable register logic.

7. The multiplier-accumulator circuit of claim 6, further comprising:

first selectable register logic having an input and an output, the output of the first selectable register logic being coupled to the first input of the multiplier and the input of the first register logic being coupled to the programmable interconnect of the PLD; and second selectable register logic having an input and an output, the output of the second selectable register logic being coupled to a third one of the plurality of inputs of the multiplexing logic and the input of the second register logic being coupled to the programmable interconnect of the PLD.

8. The multiplier-accumulator circuit of claim 5, wherein the accumulator includes a carry input, and wherein the multiplier-accumulator circuit further comprises:

carry logic having an output coupled to the carry input of the accumulator.

9. The multiplier-accumulator circuit of claim 8, wherein the carry logic includes a first input coupled to the programmable interconnect of the PLD and a second input coupled to one of the outputs of the control logic.

10. The multiplier-accumulator circuit of claim 5, wherein the multiplier-accumulator circuit is embedded within a digital signal processor (DSP) tile, wherein the PLD includes a first adjacent DSP tile and a second adjacent DSP tile, and wherein the output of the accumulator logic is further coupled to the first adjacent DSP tile.

11. The multiplier-accumulator circuit of claim 10, wherein a fifth one of the plurality of inputs of the multiplexing logic is coupled to the second adjacent DSP tile.

12. The multiplier-accumulator circuit of claim 11, wherein the pre-adder includes a third input coupled to the second adjacent DSP tile and a second output coupled to the first adjacent DSP tile.

13. An apparatus for multiplication and accumulation in a programmable logic device (PLD) integrated circuit, comprising:

a pre-adder for summing a first input and a second input to produce a pre-sum output;

a multiplier for multiplying a third input and the pre-sum output to produce a product output;

an accumulator for summing a pair of accumulator inputs to produce a sum output;

multiplexing logic for selecting the pair of accumulator inputs from a plurality of multiplexer inputs, the plurality of multiplexer inputs including the product output, the sum output, and a concatenation of respective portions of the first input of the pre-adder, the pre-sum output of the pre-adder, and the third input of the multiplier; and control logic for controlling operation of the pre-adder, the accumulator, and the multiplexer logic.

14. The apparatus of claim 13, wherein each of the first input, the second input, the third input, and the sum output is coupled to programmable interconnect of the PLD.

15. The apparatus of claim 13, wherein the pre-adder is configured to buffer the first input and the second input, the multiplier is configured to buffer the product output, and the accumulator is configured to buffer the sum output.

16. The apparatus of claim 13, wherein the plurality of multiplexer inputs includes a fourth input coupled to the programmable interconnect of the PLD, and wherein the apparatus further comprises:

first register logic for selectively buffing the third input; and second register logic for selectively buffering the fourth input.

17. The apparatus of claim 13, wherein the accumulator is further configured to account for a carry input, and wherein the apparatus further comprises:

carry logic for providing the carry input.

* * * * *